United States Patent [19]

Orban

[11] 4,241,266
[45] Dec. 23, 1980

[54] PEAK-LIMITING APPARATUS FOR AUDIO SIGNAL

[76] Inventor: Robert A. Orban, 2413 Lincoln Ave., Belmont, Calif. 94002

[21] Appl. No.: 9,758

[22] Filed: Feb. 5, 1979

Related U.S. Application Data

[63] Continuation of Ser. No. 858,720, Dec. 8, 1977, abandoned.

[51] Int. Cl.³ .......................... H03K 5/08; H03L 5/00
[52] U.S. Cl. .................... 307/237; 307/264; 328/169; 330/144; 330/281; 330/284
[58] Field of Search ................. 307/237, 264; 328/54, 328/162, 165, 168, 169, 171; 330/144, 145, 149, 279, 281, 284

[56] References Cited

U.S. PATENT DOCUMENTS

| | | | |
|---|---|---|---|
| 3,602,825 | 8/1971 | Senior | 307/264 X |
| 3,790,896 | 2/1974 | Shimizu et al. | 307/264 X |
| 3,904,971 | 9/1975 | Delagrange | 330/280 |

FOREIGN PATENT DOCUMENTS 1094357  12/1967  United Kingdom ................ 179/1 VC

*Primary Examiner*—John Zazworsky
*Attorney, Agent, or Firm*—Blakely, Sokoloff, Taylor & Zafman

[57] ABSTRACT

A circuit which provides a control signal to dynamically adjust the level of clipping for an audio signal is described. The criterion for allowable clipping employed by the circuit is whether the clipper induced distortion is noticeable; the clipper induced distortion may be audible, however, remain unnoticeable. A frequency weighted correlation is performed on the audio signal to evaluate the waveform and establish an unnoticeable level of clipping.

10 Claims, 5 Drawing Figures

PEAK-LIMITING APPARATUS FOR AUDIO SIGNAL

This is a continuation of application Ser. No. 858,720., filed Dec. 8, 1977 now abandoned.

BACKGROUND OF THE INVENTION

1. Field of the Invention

The invention relates to the field of peak-limiting circuits, particularly for audio signals.

2. Prior Art

In numerous systems such as AM broadcasting, FM broadcasting, optical film recording by the "variable area" method, carrier telephony, disc recording, and others, peak levels of signals must be controlled. Clippers, in conjunction with other circuits are frequently employed for this purpose. The clipper-induced distortion must be carefully controlled since it can be perceived as offensive distortion. On the other hand, in some of these systems, particularly AM broadcasting, it is necessary to clip as much as possible to broadcast a "loud" signal.

In copending application, Ser. No. 816,955, filed July 19, 1977, entitled "Apparatus and Method For Peak-Limiting Audio Frequency Signals" and assigned to the assignee of this application, a circuit and method is described for peak-limiting audio signals. With this system the level of audible, clipper-induced distortion is controlled. the psychoacoustic phenomena of "masking" is used to maintain a maximum non-audible level of clipping (or a constant audible level of clipping). The actual amount of clipping varies depending upon the presence of signals needed to mask the clipper induced distortion. In general with this system the distortion caused by a clipper is determined by subtracting a clipper's output from its input. This distortion is compared in a plurality of critical bands with the input audio signal to provide a gain control signal for a variable gain stage. The output of this stage is coupled to a clipper.

In the presently described system a control signal is generated which may be employed with the above referenced system or other systems to establish a dynamic level of clipping based on whether the clipping is noticeable as opposed to whether the clipping is audible.

SUMMARY OF THE INVENTION

An apparatus for peak-limiting an audio signal which provides maximum unnoticed clipping of the audio signal. The waveform of the audio signal is evaluated to determine its uniformity. In the presently preferred embodiment, a frequency weighted correlation is performed on the audio signal. If the audio signal is found to be highly periodic and correlated, that is, having future values predictable with high probability given knowledge of past values, less clipping is permitted since the clipping of such waveforms are more noticeable. If the evaluation of the audio waveform indicates that the signal is highly uncorrelated such as with bright symphonic music, more clipping is permitted. The described apparatus thus permits, by way of example, broadcasting of as loud a signal as possible without noticeable distortion. The circuit also provides an apparent improved dynamic range since voice and many solo instruments are reduced in volume when compared to the volume of more complex sounds, which are usually louder in nature.

DETAILED DESCRIPTION OF THE INVENTION

Figure 1:
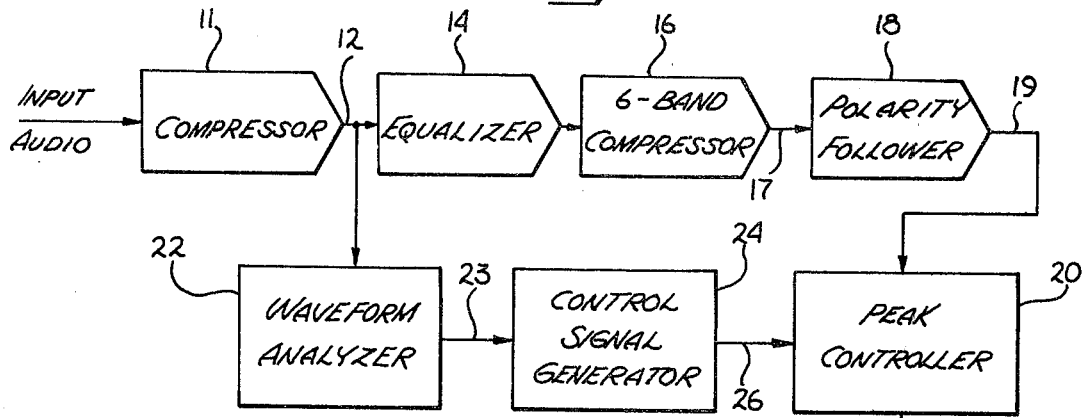
FIG. 1 is a block diagram which illustrates a portion of an amplitude modulated (AM) broadcasting system with the apparatus of the present invention.

An apparatus for controlling the peak levels of an audio signal by maintaining maximum unnoticeable levels of clipping is described. The level of clipping is established by the apparatus on the basis of whether the clipping is noticeable (offensively distorting the program material) rather than whether the clipping is audible. In the following description, many specific details are given in order that the present invention may be readily understood. However, it will be obvious to one skilled in the art that the invention may be practiced without these specific details. In other case, well-known circuits have been shown in block diagram form in order not to obscure the present invention in unnecessary detail.

The circuit of the present invention may be employed in a plurality of known systems for controlling or peak-limiting audio signals. For example, in some AM broadcasting systems, a variable gain amplifier is employed in connection with a clipper to control the peak levels of audio signals. The described circuit may be employed to control the gain of such an amplifier which, in effect, establishes the level of clipping. The described circuit may also be employed to directly establish the threshold for a clipper. In copending application, Ser. No. 816,955, filed July 19, 1977, now abandoned in favor of Ser. No. 955,322 filed Oct. 27, 1978 and assigned to the assignee of this application, a particular apparatus and method for peak-limiting audio signals are described. The control signal developed by the circuit of FIG. 2 of the present invention may be employed to control the resistance of the variable resistor 7 of FIG. 1. In practice, a variable gain amplifier is employed in place of resistor 7 with the control signal generated by the circuit of FIG. 2 of the present application used to adjust the gain of this amplifier.

The circuit of the present invention establishes a new criterion for the clipping of an audio signal. The amount of clipping is dynamically changed such that the clipping remains unnoticed. Noticeable clipping is to be distinguished from audible clipping. The timbre of a sound may be changed by clipping and such change may be audible, if compared to the original sound. However, this change of timbre may not be noticeable to a listener under ordinary circumstances. By way of analogy, when one is concentrating on reading, there may be many things visible to the eyes other than the words on a page. However, these other things, although visible, are unnoticed. The criteria for clipping in the present invention is not necessarily whether there is an audible difference in timbre caused by clipping, but rather whether this difference is noticeable or perceived as offensive distortion.

Several general observations are that the clipping of low frequency, high correlated (more periodic) sounds is very noticeable. These simpler sounds apparently are more easily analyzed by the mind and the mind is conditioned to certain expectations about these sounds. Also, the harmonics produced by the clipping of these low frequency sounds fall into the more sensitive range of the ear. Clipping is more offensive and readily noticeable when a uniform, relatively non-complex sound waveform such as that associated with voice is clipped. In contrast, clipping is less noticed for an uncorrelated (more like white noise) sound, such as that associated with a "rock group" of symphony.

In the following description, the term "correlated signal" is employed to describe a relatively uniform waveform which tends to be periodic, noncomplex with a well-ordered spectrum. This waveform is in contrast to a complex, noncorrelated waveform such as that associated with bright symphonic music.

It will be noted that the following description is directed towards an AM broadcasting system. However, it will be obvious to one skilled in the art that the described apparatus may be employed in other systems.

Referring now to FIG. 1, the compressor 11, equalizer 14 and six-band compressor 16 are sometimes employed to process the audio applied to the transmitter in an AM broadcasting system. The output of the compressor 16 is typically coupled to some means for limiting the peak levels of the audio signal. Depending upon the particular circuit employed, a polarity follower or polarity corrector is required such as polarity follower 18. The output of the follower 18, line 19, is coupled to a peak-limiting circuit shown as peak controller 20. The peak controller 20 may be any one of a plurality of known circuits for controlling the peak levels of audio signals; in the presently preferred embodiment, the apparatus described in the above mentioned copending application is employed. The output of the peak controller 20, line 28, provides a peak-limited audio signal which may be coupled to a transmitter.

The improvement of the present invention is shown in FIG. 1 as a waveform analyzer 12 which receives the output of the compressor 11 on line 12. The output of the analyzer 22 is coupled by line 23 to a control signal generator 24. The generator 24 provides a control signal on line 26 to the peak controller which control signal is used to adjust the level of clipping so as to maximize the clipping while maintaining it at an unnoticeable level.

Figure 2:
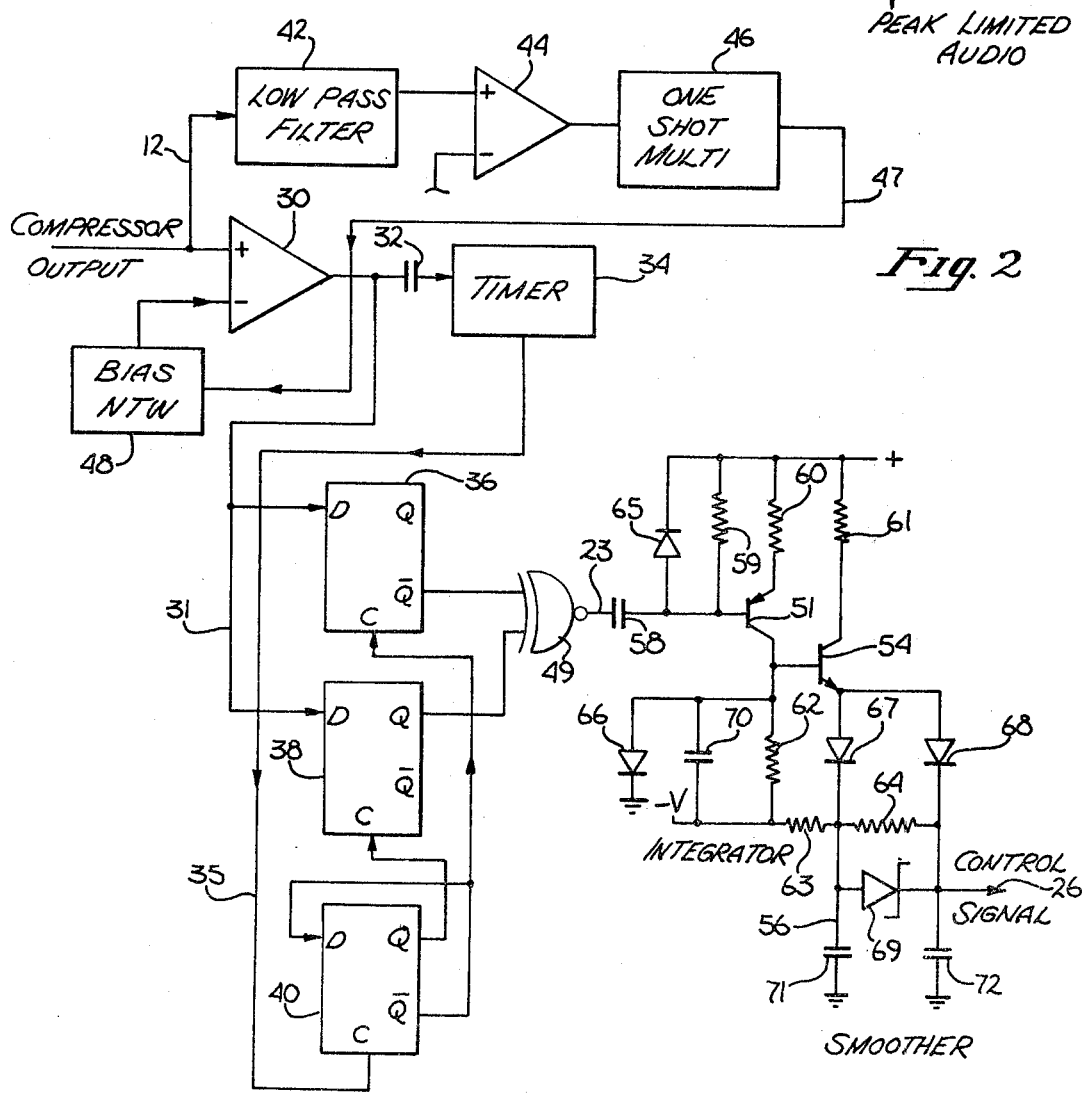
FIG. 2 is an electrical schematic of the presently preferred embodiment of the invention.

In FIG. 2 the output of the compressor 11, line 12, is shown coupled to a comparator 30 and to a lowpass filter 42. The output of the exclusive NOR gate 49, line 23, corresponds to the output of the waveform analyzer 22 of FIG. 1. In FIG. 2 the control signal generator 24 consists of an integrator and a smoothing circuit which provides an output on line 26.

The output of the 1 kHz lowpass filter 42 is coupled to the positive input terminal of a comparator 44. The negative terminal of this comparator receives a fixed negative potential. The output of the comparator 44 is coupled to a single-shot multivibrator 46. The output of the multivibrator 46 is coupled to the negative input terminal of comparator 30 through a biasing network 48. As will be described in greater detail, the lowpass filter 42, comparator 44, multivibrator 46 and network 48 are employed to prevent an output from comparator 30 when a substantial amount of low frequency components are not present in the audio signal. This circuit, for reasons which shall be explained, prevents heavy clipping.

The output of the comparator 30 is coupled through capacitor 32 to a timer 34. The timer 34 upon sensing the change from a binary-one to a binary-zero at the output of comparator 30, provides a timing pulse on line 35 forty microseconds later. Thus, the timer 34 may be any one of a plurality of well-known circuits such as a single-shot multivibrator.

Three bistable circuits, specifically D-type flip-flops 36, 38 and 40, are employed to perform a frequency weighted correlation, as will be explained. The output from the comparator 30 (line 31) is coupled to the D terminals of the circuits 36 and 38. The $\overline{Q}$ terminal of the bistable circuit 36 is coupled to one input terminal of the exclusive NOR gate 49. The other input terminal to this gate is coupled to the Q terminal of the circuit 38. The bistable circuit 40 which is employed as a toggling means, receives the timing signal from the timer 34 (line 35) at its C terminal. The Q terminal of the circuit 40 is coupled to the C terminal of the circuit 38. The $\overline{Q}$ terminal of the circuit 40 is coupled to the D terminal of circuit 40 and the C terminal of circuit 36.

The output of the gate 49 is coupled through a capacitor 58 to the base of a transistor 51. The base of this transistor is coupled to a source of positive potential through a diode 65 and a resistor 59. The emitter of this transistor is coupled to the positive potential through a resistor 60. The collector of transistor 51 is coupled to the base of transistor 54, resistor 62, capacitor 70 and diode 66. The other terminals of capacitor 70 and resistor 62 are coupled to a source of negative potential, which is also coupled to resistor 63. The collector of transistor 54 is coupled to the source of positive potential through the resistor 61. The emitter of this transistor is coupled to diodes 67 and 68. The other terminals of these diodes are coupled to the parallel combination of resistor 64 and the Zener diode 69. The node 56 is coupled to ground through capacitor 71 and the output line 27 is coupled to ground through capacitor 72.

Before the operation of the circuit of FIG. 2 is explained, one problem which may occur with heavy clipping in some systems should be noted. Heavy clipping can cause intermodulation products. This may be perceived as low frequency distortion, such as a "thickening" of sibilance. (Where the apparatus of the above referenced copending application is employed, this heavy clipping with certain program material will occur in the safety clipper 66.) This distortion can be masked by low frequency components in the program material; thus heavy clipping must be avoided unless such components are present. The filter 42, comparator 44 and multivibrator 46 are employed to prevent extreme clipping unless low frequency components are present in the program material.

To explain the operation of the circuit of FIG. 2, first the case where the audio signal on line 12 does not contain a substantial amount of low frequency components shall be discussed. For this case, the amount of clipping must be reduced since low frequency energy is not present to mask the intermodulation products which may result from heavy clipping. When the lowpass filter 42 does not pass substantial signals, no output occurs from the comparator 44 and the multivibrator 46 remains in its low state. With no signal on line 47 the biasing network 48 prevents an output signal from the comparator 30. With no output signal from the comparator 30, no timing signals occur from timer 34 and bistable circuit 40 remains in one state. The bistable circuits 36 and 38 both remain in one state since they do receive signals on their C terminals from circuit 40. This results in a constant output at gate 49 and no signal is coupled through capacitor 58 to transistor 51. For these conditions the control signal on line 26 does not cause any additional clipping to occur beyond that which might otherwise occur within the peak controller 20 of FIG. 1.

Assume now that there is sufficient low frequency energy coupled to the lowpass filter 42 and through the comparator 44 into the input terminal of the multivibrator 46. Each time a signal reaches the multivibrator 46, for the presently preferred embodiment, this device initiates a new 10 millisecond pulse. This pulse coupled through line 47 to the bias network 48 adjusts the reference potential applied to the negative terminal of comparator 30 to the level of line 77 shown in FIGS. 3a and 3b. Numerous biasing circuits which may be employed for providing the appropriate biasing levels are described in the *General Electric Transistor Manual*, Chapter 4, "Biasing and D C Amplifiers", 1964 edition.

When the signal on line 12 is above the reference level of line 77 (FIGS. 3a and 3b) a binary-one is present at the output of comparator 30; when the audio signal is below this reference level a binary zero is present at this output. Thus, when the signal on line 12 makes a positive-to-negative transition through the level of line 77, the timer 34 is activated. This, in turn, causes a timing signal to occur on line 35, forty microseconds later. Each such timing signal toggles the bistable circuit 40.

Since the Q terminal of circuit 40 is coupled to the C terminal of circuit 38 and the $\overline{Q}$ terminal is coupled to the C terminal of circuit 36, the circuits 36 and 38 alternately sample the signal on line 31. For example, first circuit 36 samples the data on line 31, then one timing pulse later, circuit 38 samples the data on line 31. This sampling always occurs forty microseconds after a positive-to-negative transition of the audio signal with respect to the reference level of line 77.

Figure 3A:
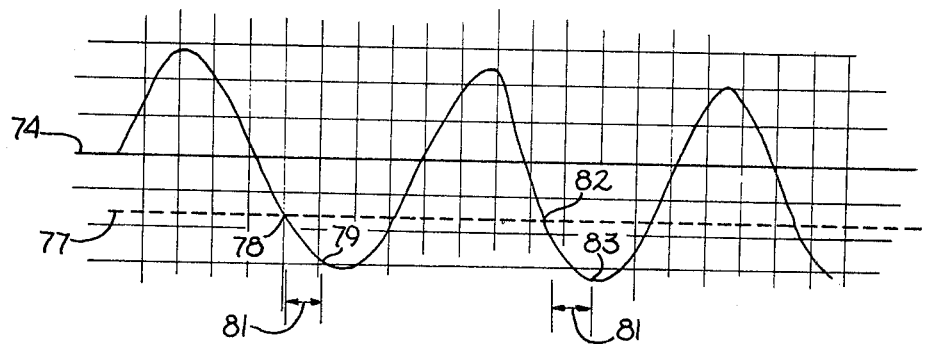
FIGS. 3a and 3b are graphs illustrating audio waveforms; these graphs are used to illustrate the operation of the circuit of FIG. 2.

Referring now to FIG. 3a, assume that the signal on line 12 (FIG. 2) is shown by the waveform on line 74 and that this signal contains sufficient low frequency energy to allow changes in data at the output of comparator 30. At time point 78 the timer 34 senses the change from a binary-one to a binary-zero at the output of comparator 30. Forty microseconds later as indicated by period 81, at point 79, bistable circuit 36 samples the data on line 31. For the waveform shown in FIG. 3a, the signal on line 31 remains a binary-zero because the audio signal is below line 77. Since the D terminal of the circuit 36 senses a binary-zero, the $\overline{Q}$ terminal of circuit 36 will be set to a binary-one.

During the next transition of the waveform from positive-to-negative through line 77 as indicated at point 82, the timer 34 again senses the transition to a binary-zero at the output of comparator 30 and forty microseconds later provides a pulse on line 35. This, as mentioned, causes the circuit 40 to toggle and this time causes the bistable circuit 38 to sense the data on line 31. Again, since during the period 81 as shown at point 83, the waveform remained below line 77, the signal on line 31 will be a binary-zero. This will set circuit 38 with the Q terminal low. Thus, for the waveform of FIG. 3a, gate 49 has one of its terminals high and the other low, which results in a low signal on line 23.

As long as the waveform is correlated, as in FIG. 3a, the inputs to gate 49 will remain constant and thus no pulses will be coupled through capacitor 58 to turn on transistor 51. This prevents the control signal on line 26 from increasing the clipping level in controller 20 (FIG. 1).

Figure 3B:
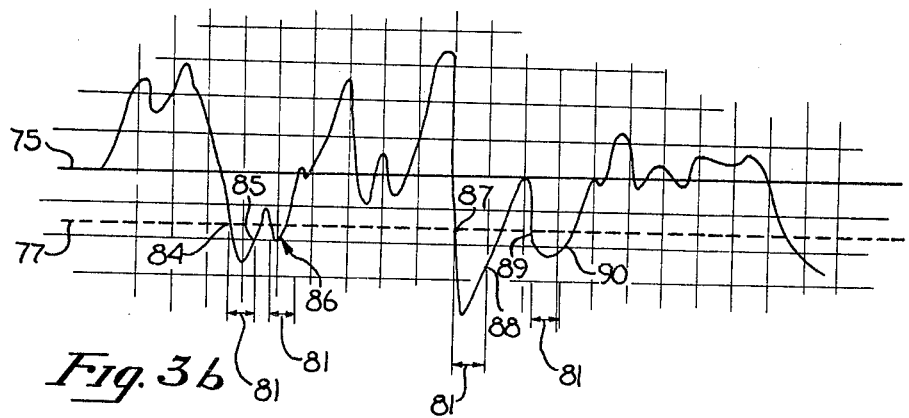

Now referring to the waveform of FIG. 3b, when this signal crosses line 77 at point 84, the output of the comparator 30 changes to a binary-zero. This again causes a timing pulse to be generated on line 35 forty microseconds later as indicated by the period 81. Assume for sake of discussion when this occurs, the circuit 36 senses the data on line 31 at time point 85. Since the waveform of FIG. 3b at point 85 is below line 77, the circuit 36 senses a binary-zero and sets the $\overline{Q}$ terminal of circuit 36 high. For the waveform of FIG. 3b a positive-to-negative transition occurs shortly after point 85 as indicated by segment 86. This time, however, at the end of the period 81, the waveform has crossed line 77 causing the bistable circuit 38 to sense a binary-one on line 31. This sets the Q terminal of the bistable circuit 38 to its high state. For these conditions the potential on line 23 rises since both inputs to the gate 49 are high. As indicated at point 87, a positive-to-negative transition again occurs through line 77. At point 88, a binary zero will be present on line 31 at the end of the period 81 setting high the $\overline{Q}$ output of circuit 36. The next positive-to-negative transition of the waveform is shown at point 89. At the end of the forty microsecond period 81, as shown at point 90, the signal on line 31 remains a binary-zero setting low the Q terminal of circuit 38. For the samples that occur at points 88 and 90, the conditions for gate 49 are met and the signal on line 23 drops.

Thus, for the uncorrelated signal of FIG. 3b, the output of gate 49 frequently changes. (This is in contrast to the waveform of FIG. 3a where the output of gate 49 remains constant.) Also, since forty microseconds is a relatively short time and transition through line 77 must occur within the forty microseconds to provide signal changes on line 23, the audio signal must include a substantial amount of high frequency components. Thus, the waveform must be irregular and jagged for changes in potential on line 23. For example, compare the waveform at segment 86 of FIG. 3b with the waveforms between points 87 and 88, and points 89 and 90.

The changes in signal on line 23 are differentiated by the capacitor 58 and resistor 59. Transistor 51 operates as a voltage-current converter and provides a current through transistor 51 in response to the differentiated signal. The pulses of current through transistor 51 are "leaky-integrated" by the combination of capacitor 70 and resistor 62. The potential on this integrator is smoothed through transistor 54 and the remainder of the circuitry coupled to this transistor. This circuitry operates as a non-linear filter. The resultant signal on line 26 when coupled to the peak controller, such as peak controller 20 of FIG. 1, permits increased clipping.

Thus to summarize, the amount of clipping permitted within the peak controller 20 is increased if the waveform is uncorrelated and contains substantial high frequency energy and if, sufficient low frequency energy exists to mask low frequency intermodulation products. It is under these conditions that some audible clipping is permitted, of course, the level of this clipping is prevented from rising to the point where the clipping becomes noticeable or offensive.

It will be apparent to one skilled in the art that other waveform analyzing means may be employed to analyze the audio signal to determine if it is highly correlated.

Figure 4:
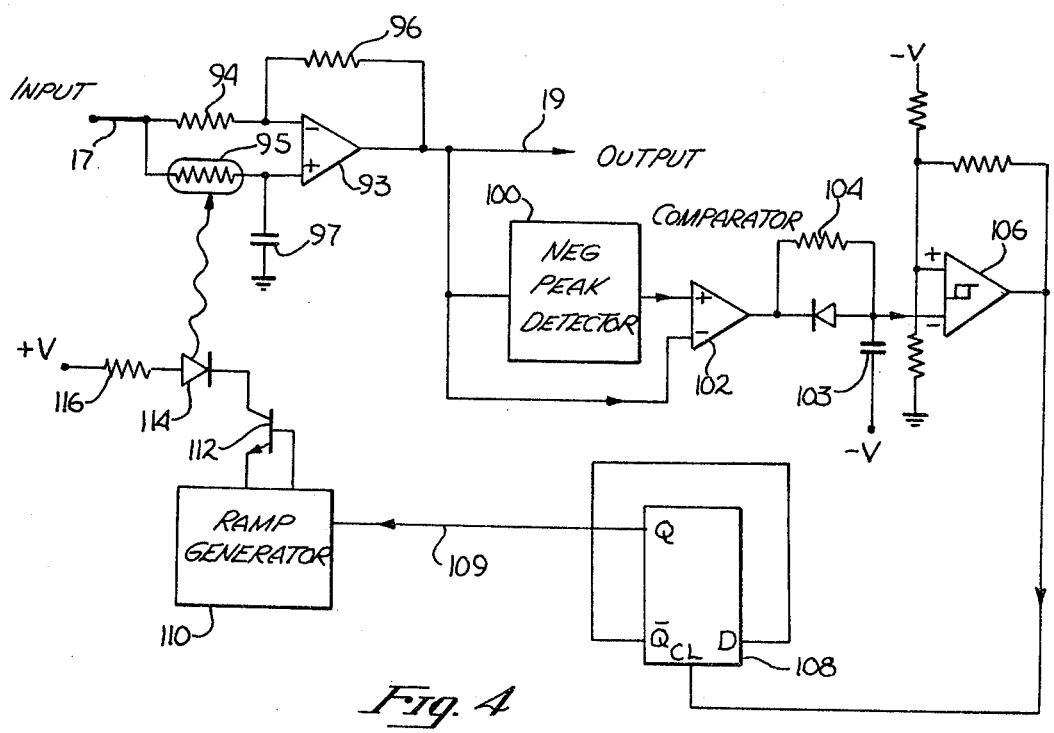
FIG. 4 is an electrical schematic of a polarity follower employed in the presently preferred embodiment.

In FIG. 4 the presently preferred embodiment of the polarity follower is illustrated. This device is used to assure that asymmetrical waveforms modulate the AM carrier to a greater extent in the positive direction rather than in the negative direction. Some asymmetry is characteristic of virtually all music and voice. Voice tends to be particularly asymmetrical; thus if voice is transmitted with incorrect polarity, considerable potential loudness and coverage area can be lost by the AM broadcaster.

Typically, polarity followers (even those employing zero crossing detection) can cause an audible "pop" when polarity is switched. Those prior art followers which wait for a pause in program material before switching do not always perform satisfactorily since many seconds may pass before switching occurs, for example, where voice is mixed with background music. As will be seen, the presently described polarity follower or switcher employs a variable phase shifter for polarity switching. This phase shifter is swept through the audio range in approximately one second in the presently preferred embodiment; thus, each frequency is shifted (or inverted) at a different time. The characteristics of the ramp controlling this shifting is shaped so that audible phase modulation is not produced. At worse, a slight audible switching can be detected for pure sine waves. Unlike some prior art polarity followers, switching may occur at any time. Moreover, since the polarity switching is not instantaneous but rather gradual, the resultant loudness improvement is likewise gradual and thus calls less attention to itself.

Referring more specifically to FIG. 4 the switching or inverting of the waveform is accomplished primarily by the operational amplifier 93 and its associated circuits. The input signal on line 17 is coupled to the negative terminal of this amplifier through resistor 94. The output of amplifier 93, line 19, is also coupled to this input terminal through resistor 96. The resistance values of resistors 94 and 96 are equal. Line 17 is also coupled to the positive input terminal of the amplifier 93 through a lowpass filter comprising the light-sensitive resistor 95 and the capacitor 97.

The determination of whether or not the polarity is correct is sensed by the circuit comprising the negative peak detector 100, comparator 102, comparator 106 and the bistable circuit 108. The line 19 is coupled to the input terminal of the negative peak detector 100. The output of this peak detector is coupled to the positive input terminal of a comparator 102. Line 19 is also coupled to the negative input terminal of this comparator. The output of this comparator is coupled through the parallel combination of a resistor 104 and a diode to the capacitor 103. Capacitor 103 is coupled to the negative input terminal of a comparator 106. The comparator 106 provides hysteresis since its output terminal is coupled to the positive input terminal, as indicated, to provide positive feedback. The output of the comparator 106 is coupled to the CL terminal of the D-type bistable circuit (flip/flop) 108. The $\overline{Q}$ terminal of this circuit is coupled to the D terminal; the Q terminal provides an output signal on line 108 which is coupled to the ramp generator 110.

The ramp generator 110 provides a ramp signal (inclined and declined ramp) having a period of approximately one second for the presently preferred embodiment. This ramp signal through transistor 112, provides current for the resistor 116 and the light emitting diode 114. The light emitting diode 114 is optically coupled to the light-sensitive resistor 95.

The amplifier 93 with its input circuitry and resistor 96 provides a first-order allpass network having a phase response which may be varied from 0° at low frequencies to 180° at high frequencies. The 90° phase shift frequency may be varied from substantially below the audio range to substantially above the audio range. This variation is controlled by the current through the light emitting diode 114 which, in turn, varies the resistance of resistor 95. The input audio signal on line 17 provides a ground reference for the amplifier 93 through the lowpass filter comprising resistor 95 and capacitor 97. The amplifier 93 subtracts the output of this lowpass filter from the input signal on line 17. The signal coupled to the amplifier 93 through the resistor 94 is amplified by a gain of $-1$ since the resistors 94 and 96 have equal resistance. The non-inverting gain of this circuit is $+2$. Thus the output of the lowpass filter as amplified with a gain of $+2$ appears as a component of the output of the amplifier 93. When the inverting and non-inverting components are added at the output on line 19, an allpass function results. Note that the overall gain of the amplifier 93 is unity and its frequency response is substantially flat in the presently preferred embodiment from 30 to 15,000 Hz.

As the current through the LED 114 decreases (ramp function) it causes the resistance of resistor 95 to increase. The input signal on line 17 is inverted on line 19 as the cutoff frequency of the lowpass filter decreases until it is substantially below 20 Hz. Likewise as the current through diode 114 increases, the signal on line 19 changes to a non-inverting output. It is apparent that the change from inverting to non-inverting and vice versa occurs gradually since, in effect, each frequency is inverted at a different time. As mentioned, approximately one second is required for the total shift.

For the system as implemented, the negative going waveform of the audio signal on line 19 provides positive modulation of the carrier. Thus, if the positive peaks on line 19 exceed the negative peaks then polarity reversal is necessary. The negative peaks are detected by detector 100 and compared with the positive peaks by comparator 102. As presently implemented, if the positive peaks exceed the negative peaks by a factor of approximately 1.2, then the output of comparator 102 discharges capacitor 103. As implemented, a single peak is generally insufficient to discharge capacitor 103 to the extent necessary to activate the comparator 106. When a sufficient number of closely spaced peaks occurs causing the discharge of capacitor 103, a positive output signal results at the output of the comparator 106. (The recharging time of capacitor 103 is greater than one second since resistor 104 is relatively large. This slow recharging is necessary to provide ample time for the switching circuit to change the polarity.) The comparator 106 as mentioned, includes hysteresis due to positive feedback. This hysteresis along with the use of two comparators (102 to 106) in a cascaded configuration assures that polarity switching only occurs on consistently asymmetrical waveforms.

Each time a positive going transition occurs at the output of comparator 106, the bistable circuit 108 changes state. The state of the bistable circuit 108 determines whether the polarity is to be inverting or non-inverting. The signal on line 109 causes the ramp generator 110 to generate the appropriate positive-going or negative-going ramp. This, in turn, controls the current through the LED 114 to provide the correct polarity on line 19.

As presently implemented, the ramp generator 110 provides a shaped ramp which minimizes the audibility of the switching. The shaping is accomplished by use of a diode/resistor network. This non-linear network provides a piecewise approximation of an optimum curve and employs three breakpoints.

Thus, with the polarity follower of FIG. 4, the polarity is smoothly corrected and unnecessary switching is prevented.

Thus, a circuit has been described which provides a control signal to dynamically adjust the level of clipping for an audio signal. The criteria for clipping employed by the circuit is whether the clipper induced distortion is noticeable, which criteria is to be distinguished from an audible clipping level. A unique polarity follower has also been described which corrects the polarity of the audio signal to assure that greater modulation of the carrier occurs in the positive direction than in the negative direction.

I claim:

1. An apparatus for peak-limiting an audio signal comprising:
    evaluation means for evaluating said audio signal to determine the degree to which future values of said audio signal are predictable based on past values of said audio signal;
    control signal generation means for generating a control signal to affect the amount of clipping of said audio signal, said generation means coupled to said evaluation means, said control signal permitting increased clipping when said audio signal is less predictable;
    whereby more unnoticeable clipping is permitted.

2. The apparatus defined by claim 1 wherein said increased clipping occurs only when said audio signal contains substantial low frequency components.

3. The apparatus defined by claim 2 wherein said increased clipping occurs only when said audio signal contains substantial high frequency components.

4. In an apparatus for controlling the peak levels of an audio signal which includes a clipper, an improvement for controlling the amount of signal clipping in said clipper, comprising:
    waveform analyzing means for determining the degree to which future values of said audio signal are predictable based on past values of said audio signal;
    control means for controlling said level of clipping, said control means increasing said level of clipping for an audio signal which is less predictable, said control means coupled to said waveform analyzing means;
    whereby said level of clipping may be controlled to permit audible but unnoticeable clipping.

5. The improvement of claim 4 including additional means for preventing said level of clipping from increasing when said audio signal lacks substantial components of low frequency energy.

6. The improvement of claim 5 wherein said increased levels of clipping occur only when said audio signal contains substantial components of high frequency energy.

7. The improvement of claim 4 wherein said waveform analyzing means comprises:
    circuit means for providing a timing signal when said audio signal equals a predetermined level, and
    sample means for sampling a signal representative of said audio signal, said sample means coupled to said circuit means.

8. The improvement defined by claim 7 wherein said circuit means includes a comparator with its output coupled to a timing generator.

9. The improvement defined by claim 8 wherein said sample means includes a pair of bistable circuits which alternately sample said output of said comparator.

10. The improvement defined by claim 9 wherein said bistable circuits are coupled to a logic gate.

* * * * *